United States Patent
Rofougaran et al.

(10) Patent No.: US 8,249,650 B2
(45) Date of Patent: *Aug. 21, 2012

(54) METHOD AND SYSTEM FOR BLUETOOTH, NEAR FIELD COMMUNICATION AND SIMULTANEOUS FM TRANSMISSION AND RECEPTION FUNCTIONS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/099,457

(22) Filed: May 3, 2011

(65) Prior Publication Data

US 2011/0206099 A1 Aug. 25, 2011

Related U.S. Application Data

(63) Continuation of application No. 11/754,600, filed on May 29, 2007, now Pat. No. 7,937,107.

(60) Provisional application No. 60/895,698, filed on Mar. 19, 2007.

(51) Int. Cl.
*H04M 1/00* (2006.01)

(52) U.S. Cl. ............... 455/552.1; 455/184.1; 455/185.1; 455/188.1; 455/192.1; 340/10.1

(58) Field of Classification Search ............... 455/552.1, 455/412, 185.1; 340/10.1, 572.1, 5.53
See application file for complete search history.

(56) References Cited

U.S. PATENT DOCUMENTS

| | | | |
|---|---|---|---|
| 7,342,497 B2 | 3/2008 | Chung et al. | |
| 7,555,271 B2* | 6/2009 | Peng | 455/118 |
| 7,869,948 B2* | 1/2011 | Han | 701/213 |
| 2002/0126013 A1 | 9/2002 | Bridgelall | |
| 2005/0003785 A1* | 1/2005 | Jackson et al. | 455/260 |
| 2006/0072647 A1 | 4/2006 | Feher | |
| 2007/0030116 A1* | 2/2007 | Feher | 340/5.53 |
| 2007/0087750 A1 | 4/2007 | Uchida | |
| 2008/0180220 A1 | 7/2008 | Hollister et al. | |

* cited by examiner

*Primary Examiner* — Anthony Addy
*Assistant Examiner* — Shahriar Behnamian
(74) *Attorney, Agent, or Firm* — Farjami & Farjami LLP

(57) ABSTRACT

A method for wireless communication may include, in an RF chip including transmit and receive functions, performing generating a first signal to enable transmission and/or reception of Bluetooth signals. The first signal may be input to a plurality of direct digital frequency synthesizers (DDFSs). The plurality of DDFSs may be clocked via the generated first signal to enable simultaneous transmission and reception of frequency modulated (FM) signals, and to enable transmission and/or reception of near field communication (NFC) signals. The first signal may be generated via a local oscillator generator (LOGEN) to enable the transmission and/or reception of the Bluetooth signals. The first signal may be generated via a phase locked loop (PLL) to enable the transmission and/or reception of the Bluetooth signals.

21 Claims, 9 Drawing Sheets

METHOD AND SYSTEM FOR BLUETOOTH, NEAR FIELD COMMUNICATION AND SIMULTANEOUS FM TRANSMISSION AND RECEPTION FUNCTIONS

CROSS-REFERENCE TO RELATED APPLICATIONS/INCORPORATION BY REFERENCE

This application is a continuation of U.S. application Ser. No. 11/754,600 filed May 29, 2007, which in turn makes reference to, claims priority to and claims the benefit of: U.S. Provisional Patent Application Ser. No. 60/895,698 filed on Mar. 19, 2007.

This application also makes reference to:
U.S. patent application Ser. No. 11/754,481 filed May 29, 2007;
U.S. patent application Ser. No. 11/754,460 filed May 29, 2007;
U.S. patent application Ser. No. 11/754,581 filed May 29, 2007;
U.S. patent application Ser. No. 11/754,621 filed May 29, 2007;
U.S. patent application Ser. No. 11/754,490 filed May 29, 2007;
U.S. patent application Ser. No. 11/754,708 filed May 29, 2007;
U.S. patent application Ser. No. 11/754,768 filed May 29, 2007;
U.S. patent application Ser. No. 11/754,705 filed May 29, 2007;
U.S. patent application Ser. No. 11/754,407 filed May 29, 2007; and
U.S. patent application Ser. No. 11/754,438 filed May 29, 2007.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for Bluetooth, near field communication and simultaneous FM transmission and reception functions.

BACKGROUND OF THE INVENTION

Mobile terminals that support audio applications are becoming increasingly popular and, consequently, there is a growing need to provide a simple and complete solution for audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via FM broadcast communication, for example. Other users may use mobile terminals that have near field communication (NFC) capability.

Near field communication (NFC) is a communication standard that enables wireless communication devices, such as cellular telephones, SmartPhones, and personal digital assistants (PDAs) to establish peer-to-peer (P2P) networks. NFC may enable electronic devices to exchange data and/or initiate applications automatically when they are brought in close proximity, for example ranging from touching, or 0 cm, to a distance of about 20 cm. NFC may enable downloading of images stored in a digital camera, to a personal computer, or downloading of audio and/or video entertainment to MP3 devices, or downloading of data stored in a SmartPhone to a personal computer, or other wireless device, for example. NFC may be compatible with smart card technologies and may also be utilized to enable purchase of goods and services.

However, collocating several mobile applications in a single mobile terminal may lead to some difficulties. For example, the various applications may operate in different frequency spectrums, and therefore may need different oscillator circuits. Support for the various oscillators may require extra power, which is already a scarce resource for a mobile device, as well as additional device count and related layout real estate. An output clock signal from an oscillator may pick up interfering signals from other clock signals from other oscillators.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for Bluetooth, near field communication and simultaneous FM transmission and reception functions, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for Bluetooth, near field communication and simultaneous FM transmission and reception functions. Exemplary aspects of the invention include generating a first signal to enable transmission and/or reception of Bluetooth signals, and clocking a plurality of direct digital frequency synthesizers via the generated first signal to enable simultaneous transmission and reception of frequency modulated signals, and also enable transmission and/or reception of near field communication signals. The first signal may be generated via a Bluetooth LOGEN or a Bluetooth PLL, and may comprise an in-phase component and a quadrature component. The frequency of the first signal may be within the range of 2.4 GHz to 2.483 GHz, or may be at a frequency that may be frequency divided and then mixed with the first signal to result in a signal with a frequency within the range of 2.4 GHz to 2.483 GHz. One or more control word inputs may be generated to control each of the plurality of direct digital frequency synthesizers. The one or more control word inputs may be adjusted to compensate for changes in frequency of the generated first signal. Simultaneous NFC transmission and NFC reception may be simulated by switching the generated one or more control word inputs to one or more of the plurality of direct digital frequency synthesizers, and may be switched between a plurality of values in successive time intervals to perform time division duplexing of the NFC transmission and NFC reception. The NFC transmission may occur at a first frequency and the NFC reception may occur at a second frequency.

Figure 1A:
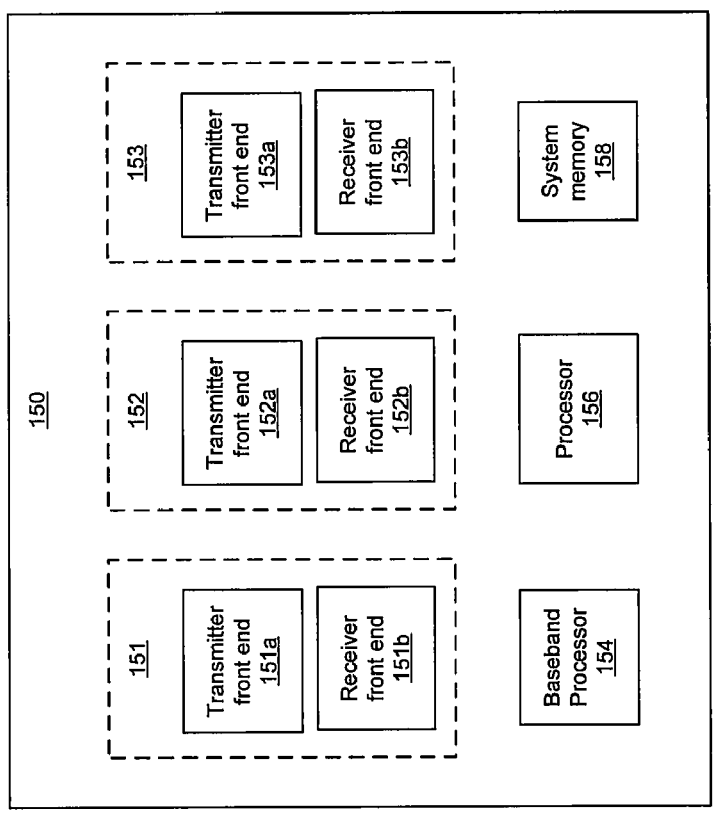
FIG. 1A is a block diagram of an exemplary system that enables Bluetooth communication, near field communication and FM transmission and/or reception, in accordance with an embodiment of the invention.

FIG. 1A is a block diagram of an exemplary system that enables Bluetooth communication, near field communication and FM transmission and/or reception, in accordance with an embodiment of the invention. Referring to FIG. 1A, there is shown a mobile terminal 150 comprising a plurality of transceivers 151, 152, and 153, a baseband processor 154, a processor 156, and system memory 158. The transceivers 151, 152, and 153 may each comprise a transmitter front end 151a, 152a, 153a, respectively, and a receiver front end 151b, 152b, 153b, respectively.

The transmitter front ends 151a, 152a, and 153a may comprise suitable circuitry, logic, and/or code that may be adapted to process and transmit RF signals. The antennas that may be used to transmit the signals are not shown. The transmitter front ends 151a, 152a, and 153a may be communicated baseband signals to be transmitted from a baseband processor, such as, for example, the baseband processor 154. The signals may then be, for example, filtered, amplified, upconverted, and/or modulated for transmission. The baseband signal may be analog or digital depending on the functionality of the transmitter front end 151a, 152a, or 153a and the baseband processor 154.

The receiver front ends 151b, 152b, and 153b may comprise suitable circuitry, logic, and/or code that may be adapted to receive and process RF signals. The antennas that may be used to receive the signals are not shown. The receiver front ends 151b, 152b, and 153b may amplify, filter, downconvert, and/or demodulate the received signals to generate a baseband signal. The baseband signal may be analog or digital depending on the functionality of the receiver front end 151b, 152b, or 153b and the baseband processor 154.

The baseband processor 154 is depicted as a single block for the sake of simplicity, however, the invention need not be so limited. For example, other embodiments of the invention may comprise a plurality of baseband processors for processing signals to and/or from the transceivers 151, 152, and 153.

The baseband processor 154 may comprise suitable circuitry, logic, and/or code that may be adapted to process received baseband signals from the receiver front ends 151b, 152b, and 153b. The baseband processor 154 also may comprise suitable logic, circuitry, and/or code that may be adapted to process a baseband signal for communication to the transmitter front ends 151a, 152a, and 153a.

The processor 156 may comprise suitable logic, circuitry, and/or code that may be adapted to control the operations of the transceivers 151, 152, and 153 and/or the baseband processor 154. For example, the processor 156 may be utilized to update and/or modify programmable parameters and/or values in a plurality of components, devices, and/or processing elements in the transceivers 151, 152, and 153 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

The processor 156 may utilize the received control and/or data information to determine a mode of operation for the transceivers 151, 152, and/or 153. For example, the processor 156 may control each of the receiver front ends 151b, 152b, and 153b to receive RF signals at a specific frequency. Similarly, the processor 156 may control each of the transmitter front ends 151a, 152a, and 153a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the processor 156. This information stored in system memory 158 may be transferred to the receiver front end 152 from the system memory 158 via the processor 156. The system memory 158 may comprise suitable circuitry, logic, and/or code that may be adapted to store a plurality of control and/or data information, including parameters needed to calculate frequencies and/or gain, and/or the frequency value and/or gain value.

The mobile terminal 150 may be enabled to communicate utilizing a plurality of wireless communication protocols, Bluetooth, near field communication, and FM, for example. In an embodiment of the invention, an FM transmitter and receiver, along with other wireless functionalities such as Bluetooth and near field communication (NFC) may be integrated onto a single chip. The size of a system, such as a cellular phone with multi-protocol capability, may be greatly reduced if the radio functions for these protocols may be integrated onto a single chip.

Figure 1B:
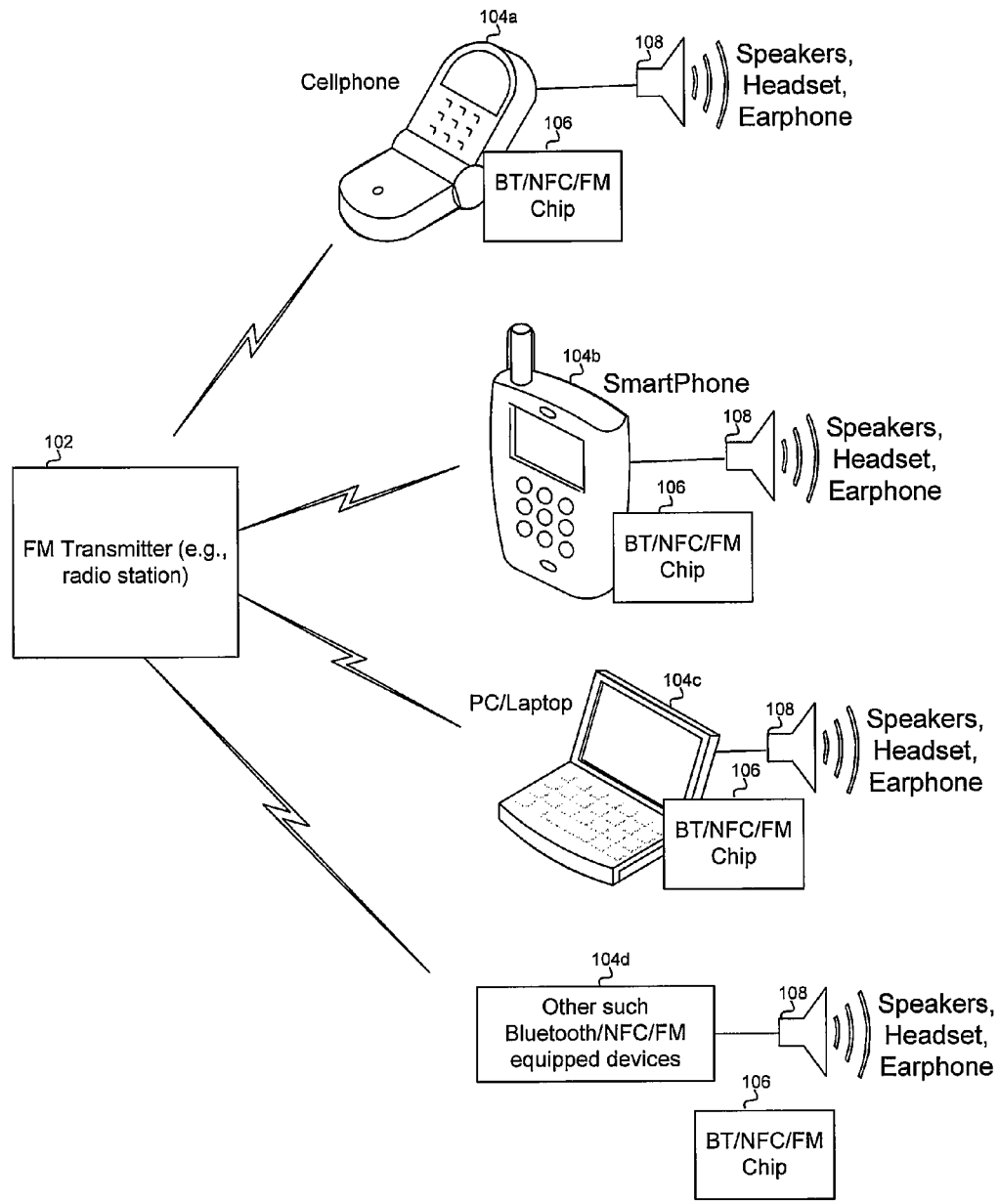
FIG. 1B is a block diagram of an exemplary FM transmitter that communicates with handheld devices that utilize a single chip with integrated Bluetooth, near field communication and FM radios, in accordance with an embodiment of the invention.

FIG. 1B is a block diagram of an exemplary FM transmitter that communicates with handheld devices that utilize a single chip with integrated Bluetooth, near field communication and FM radios, in accordance with an embodiment of the invention. Referring to FIG. 1B, there is shown an FM transmitter 102, a cellular phone 104a, a smart phone 104b, a computer 104c, and an exemplary FM, NFC and Bluetooth-equipped device 104d. The FM transmitter 102 may be implemented as part of a radio station or other broadcasting device, for example. Each of the cellular phone 104a, the smart phone 104b, the computer 104c, and the exemplary FM, NFC and Bluetooth-equipped device 104d may comprise a single chip 106 with integrated Bluetooth, NFC and FM radios for supporting FM, NFC and Bluetooth data communications. The FM transmitter 102 may enable communication of FM audio data to the devices shown in FIG. 1B by utilizing the single chip 106. Each of the devices in FIG. 1B may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and/or a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices are shown in FIG. 1B, the single chip 106 may be utilized in a plurality of other devices and/or systems that receive and use Bluetooth, NFC and/or FM signals. In one embodiment of the invention, the single chip Bluetooth, NFC and FM radio may be utilized in a system comprising a WLAN radio.

Figure 1C:
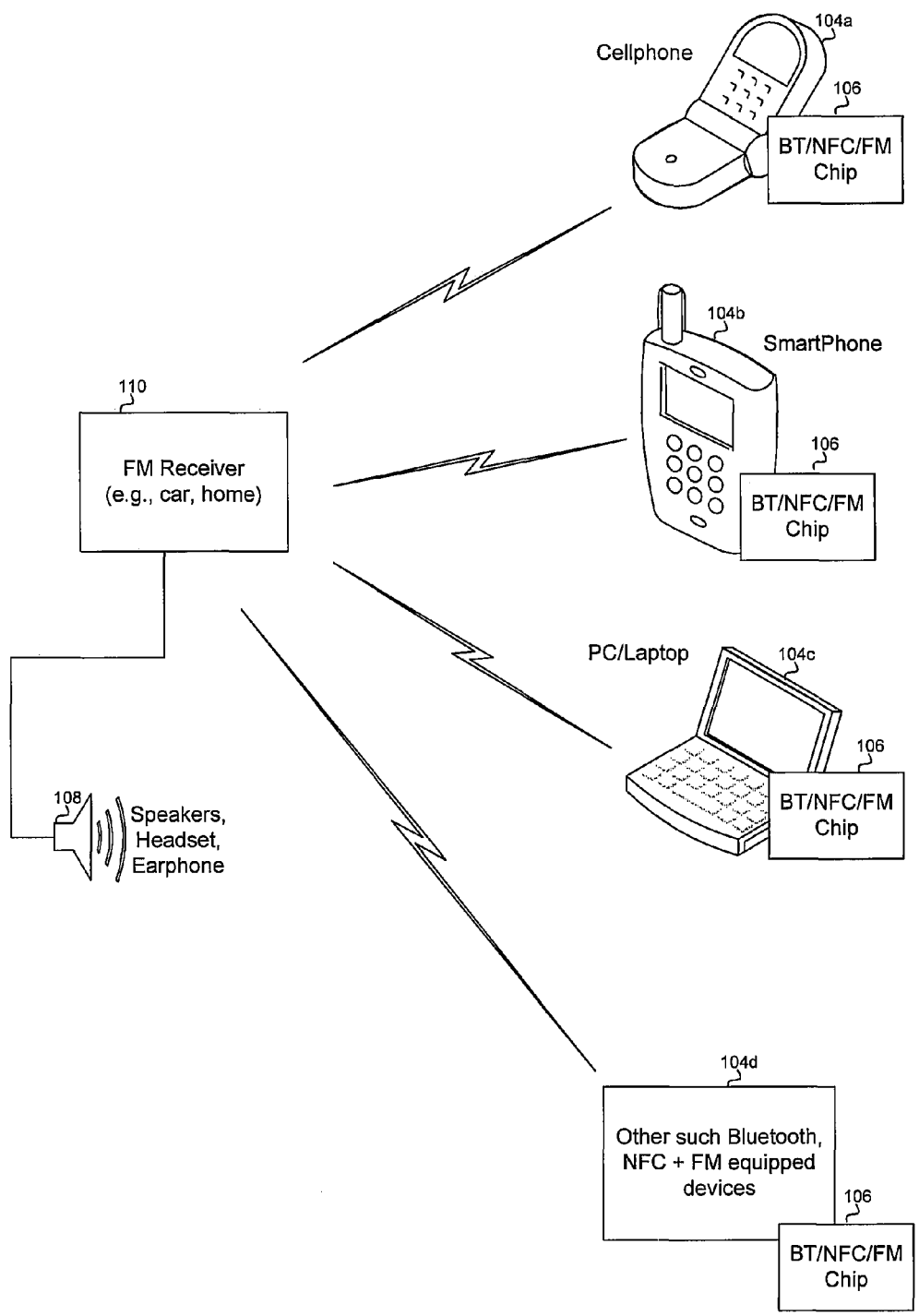
FIG. 1C is a block diagram of an exemplary FM receiver that communicates with handheld devices that utilize a single chip with integrated Bluetooth, NFC and FM radios, in accordance with an embodiment of the invention.

FIG. 1C is a block diagram of an exemplary FM receiver that communicates with handheld devices that utilize a single chip with integrated Bluetooth, NFC and FM radios, in accordance with an embodiment of the invention. Referring to FIG. 1C, there is shown an FM receiver 110, the cellular phone 104a, the smart phone 104b, the computer 104c, and the exemplary FM, NFC and Bluetooth-equipped device 104d. In this regard, the FM receiver 110 may comprise and/or may be communicatively coupled to a listening device 108. A device equipped with the Bluetooth, NFC and FM transceivers, such as the single chip 106, may be able to broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines a Bluetooth, NFC and FM transceiver and/or receiver may be utilized in a plurality of other devices and/or systems that receive and use an FM signal.

Figure 1D:
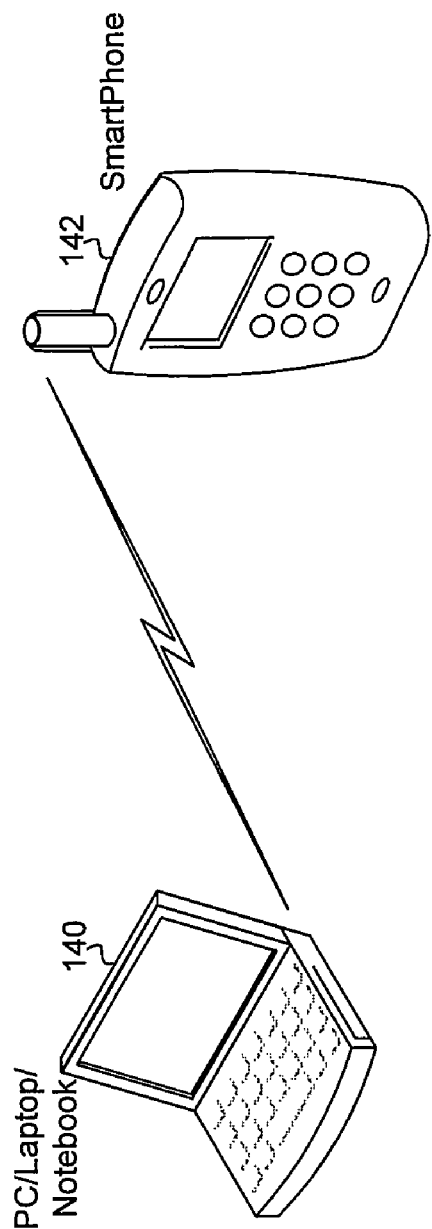
FIG. 1D is a diagram illustrating a near field communication (NFC) system, in accordance with an embodiment of the invention.

FIG. 1D is a diagram illustrating a near field communication (NFC) system, in accordance with an embodiment of the invention. Referring to FIG. 1D, there is shown a personal computer (PC) 140, and a smart hone 142. FIG. 1D may illustrate the download of data stored in a smart phone 142, such as an address book, to a PC 140.

When a device, such as the smart phone 142 attempts to transmit data, it may generate an electromagnetic field in its proximate vicinity. The PC 140 may detect corresponding electromagnetic energy, which may cause initiation of an NFC P2P communication. The smart phone 142 may generate a signal based on the data to be transmitted, which may cause variations in the electromagnetic field. The PC 140 may detect variations in the corresponding electromagnetic energy that may enable the PC 140 to receive the data transmitted by the smart phone 142.

Near Field Communication (NFC) is a low speed communication protocol. NFC may be used, for example, to set up a Bluetooth communication link between two computers by simply touching the two computers to open a connection to exchange the parameters of the Bluetooth communication. A Bluetooth communication session may be established as a second step of this procedure without any human interference. Once the communication session is established, the computers may be moved away from each other but the communication may continue via the Bluetooth communication session that was established previously. The same procedure may be used to establish a wireless link, for example, Bluetooth, or Wi-Fi, between two computers or consumer electronics devices like TVs, laptop computers, PDAs, mobile phones, and/or smart phones.

The NFC protocol is based on a wireless interface in which there may be two parties to the communication. Accordingly, the protocol may be referred to as a peer-to-peer communication protocol. The NFC protocol may be utilized to establish wireless network connections between network appliances and consumer electronics devices. The NFC interfaces operate in the unregulated RF band of 13.56 MHz. This means that no restrictions are applied and no licenses are required for the use of NFC devices in this RF band. Of course, each country imposes certain limitations on the electromagnetic emissions in this RF band. These limitations mean that, in practice, the distance at which the devices may connect with each other is restricted and this distance may vary from country to country. Operating distances of 0-20 cm may be generally utilized for NFC. The bit rate=(Dxfc)/128, where D=2N and N=0 to 6. Data may be Manchester encoded using ASK modulation.

As is often the case with the devices sharing a single RF band, the communication may be half-duplex. The devices may implement a "listen before talk" policy, in which a device first listens on the carrier frequency and start transmitting a signal only if no other transmitting device is detected. The NFC protocol distinguishes between an initiator and a target of the communication. Any device may be either an initiator or a target. The initiator may be the device that initiates and controls the exchange of data. The target may be the device that answers the request from the initiator. The NFC protocol also may distinguish between two modes of operation, namely, an active mode and a passive mode. NFC compliant devices may support both communication modes. In the active mode of communication, the initiator and target devices may generate their own RF field to carry the data. In the passive mode of communication, only one device may generate the RF field while the other device uses load modulation to transfer the data. The NFC protocol specifies that the initiator is the device responsible to generate the RF field.

Communication using NFC protocol may be desirable since it provides some features not found in other general-purpose protocols. First of all, it is a very short-range protocol. It supports communication at distances measured in centimeters. The devices have to be literally almost touched to establish the link between them. This has some important consequences. The devices may rely on the protocol to be inherently secured since the devices must be placed very close to each other. It is easy to control whether the two devices communicate by simply placing them next to each other or keeping them apart. The procedure utilized for establishing the protocol may be inherently familiar to people, since if it may be desirable to have two devices communicate, the two devices may be brought within range, on the order of centimeters, of each other. This allows for the establishment of a network connection between the devices to be completely automated and transparent. The whole process may appear as though the devices recognize each other by touch and connect to each other once touching occurs.

Another important feature of this protocol may be the support for the passive mode of communication. This is very important for battery-powered devices since they may place conservation of the energy as the first priority. The protocol may allow a device, such as a mobile phone, to operate in a power-saving mode, namely, the passive mode of NFC. This mode does not require both devices to generate the RF field and allows the complete communication to be powered from one side only. Of course, the device itself will still need to be powered internally but it may not have to "waste" the battery on powering the RF communication interface.

Also, the protocol may be used easily in conjunction with other protocols to select devices and automate connection set-up. As was demonstrated in the examples of use above, the parameters of other wireless protocols may be exchanged allowing for automated set-up of other, longer-range connections. The difficulty in using longer-range protocols like Bluetooth or Wireless Ethernet is in selecting the correct device out of the multitude of devices in the range and providing the right parameters for the connection. Using NFC, the whole procedure is simplified to a mere touch of one device to another.

In accordance with an embodiment of the invention, the integration of near field communication (NFC), Bluetooth and FM transmission and/or reception may be integrated onto a single chip. The size of a wireless system may be greatly reduced if the radio functions for these protocols are integrated onto a single chip. The integration of an NFC system with FM and Bluetooth functionality may enable the production of a portable communication device with compact size and efficient power usage. A handheld device, such as the smart phone 142, may be able to receive FM radio signals, transmit cellular or audio file signals to an FM receiver, communicate with an automatic payment system in a grocery store utilizing NFC, and communicate with a Bluetooth headset, to name a few examples.

Figure 2:
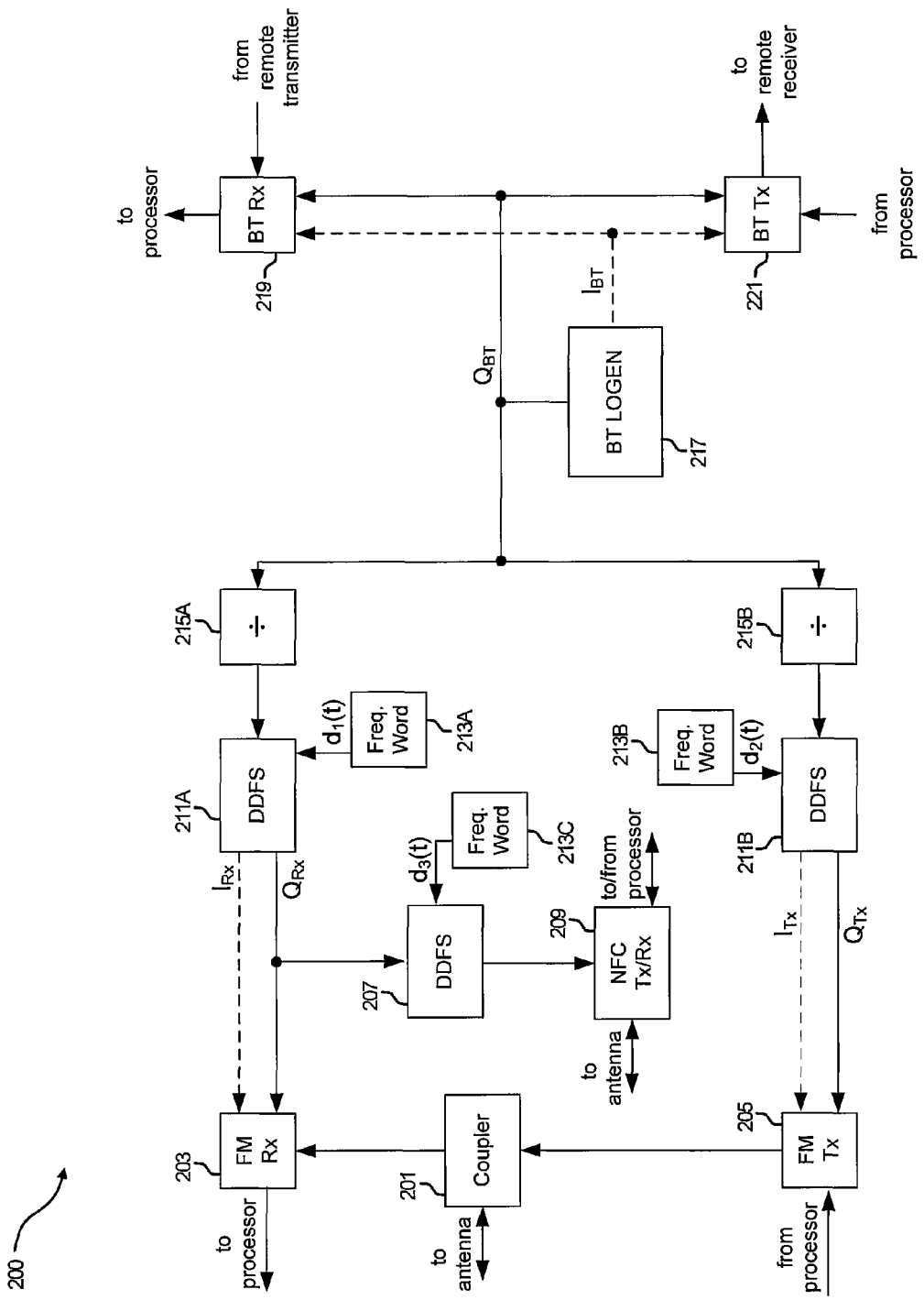
FIG. 2 is a block diagram illustrating an exemplary system that enables Bluetooth communication, near field communication (NFC) and FM transmission and/or reception, in accordance with an embodiment of the invention.

FIG. 2 is a block diagram illustrating an exemplary system that enables Bluetooth communication, near field communication (NFC) and FM transmission and/or reception, in accordance with an embodiment of the invention. Referring to FIG. 2, there is shown Bluetooth/NFC/FM radio 200 comprising a coupler 201, an FM receiver 203, an FM transmitter 205, direct digital frequency synthesizers (DDFSs) 207, 211A and 211B, an NFC receiver/transmitter 209, frequency word blocks 213A, 213B and 213C, dividers 215A and 215B, a Bluetooth LOGEN 217, a Bluetooth receiver 219 and a Bluetooth transmitter 221. There is also shown frequency control signals $d_1(t)$, $d_2(t)$ and $d_3(t)$ and in-phase and quadrature signals $I_{Rx}$, $Q_{Rx}$, $I_{Tx}$, $Q_{Tx}$, $I_{BT}$ and $Q_{BT}$.

The Bluetooth LOGEN 217 may comprise suitable circuitry, logic and/or code for generating a clock signal at a frequency that may be utilized by a Bluetooth receiver and transmitter, such as the Bluetooth receiver 219 and the Bluetooth transmitter 221. In another embodiment of the invention, the Bluetooth LOGEN 217 may comprise a phase locked loop (PLL). The Bluetooth LOGEN 217 may generate an output signal in a frequency of 2.4 GHz to 2.483 GHz, for example. In another embodiment of the invention, the Bluetooth LOGEN 217 may generate an clock signal at a frequency that may be divided and subsequently mixed with the original clock signal such that resulting output signal may have a frequency within the range of 2.4 GHz to 2.483 GHz. For example, the clock signal may be at a frequency of 1.6 GHz. This frequency may be divided by 2 to 800 MHz, which may then be mixed with the original 1.6 GHz clock signal, resulting in a 2.4 GHz output signal.

The Bluetooth receiver 219 may comprise suitable circuitry, logic and/or code that may enable reception of Bluetooth signals, such as from a Bluetooth transmitter in a wireless headset, for example. The Bluetooth receiver 219 may receive as inputs, $I_{BT}$ and $Q_{BT}$ signals generated by the Bluetooth PLL 217, and a Bluetooth signal received from a remote transmitter. The Bluetooth receiver 219 may generate an output signal that may be communicated to a processor, such as the baseband processor 154 described with respect to FIG. 1A.

The Bluetooth transmitter 221 may comprise suitable circuitry, logic and/or code that may enable transmission of Bluetooth signals, to a remote receiver such as a Bluetooth receiver in a wireless headset, for example. The Bluetooth transmitter 221 may receive as inputs, $I_{BT}$ and $Q_{BT}$ signals generated by the Bluetooth PLL 217, and a signal from a processor, such as the baseband processor 154 described with respect to FIG. 1A.

The dividers 215A and 215B may comprise suitable circuitry, logic and/or code that may enable converting the frequency of an input signal to a signal with a frequency that may equal the input frequency divided by an integer. For example, the dividers 215A and 215B may receive an input signal at a frequency of 1.6 GHz, and generate an output signal with a frequency of 800 MHz.

The DDFSs 207, 211A and 211B may be digitally-controlled signal generators that may vary analog output signals over a large range of frequencies, based on a single fixed-frequency precision reference clock. The input clock signals for the DDFSs 211A and 211B may comprise the output signals of the dividers 215A and 215B, respectively, and the input clock signal for the DDFS 207 may comprise the quadrature signal $Q_{Rx}$ generated by the DDFS 211A. The DDFSs 207, 211A and 211B may be phase-tunable, and the DDFS 211A and 211B may generate quadrature and in-phase signals, as opposed to a single output signal.

The digital input signals $d_1(t)$, $d_2(t)$ and $d_3(t)$ generated by the frequency word blocks 213A, 213B and 213C may comprise control information about the frequency and/or phase of the analog output signal that may be generated by the respective DDFS. The input clock signals may provide a reference clock that may be N times higher than the frequency that may be generated at the output signal. Using the input clock signals and the information that may be contained in the digital input signal $d_1(t)$, $d_2(t)$ and/or $d_3(t)$, the DDFSs 207, 211A and 211B may generate one or more variable frequency analog output signals.

The NFC transmitter/receiver (Tx/Rx) 209 may comprise suitable circuitry, logic and/or code that may enable receiving and/or transmitting near field communication signals, as described with respect to FIG. 1D. The NFC Tx/Rx 209 may receive as inputs, signals generated by a processor, such as the baseband processor 154, described with respect to FIG. 1A, and the $Q_{Rx}$ output signal generated by the DDFS 207, to generate an output signal to be communicated to an antenna for transmission. The NFC Tx/Rx 209 may also receive input signals received from an antenna, and may downconvert and filter the signals, for example, before communicating the resulting output signal to a processor.

The FM receiver 203 may comprise suitable circuitry, logic and/or code that may enable the reception of an FM signal via the coupler 201 and an antenna, not shown. The FM receiver 203 may receive as inputs, in-phase and quadrature signals $I_{Rx}$ and $Q_{Rx}$ from the DDFS 211A, and a signal received by an antenna via the coupler 201. The FM receiver 203 is described further with respect to FIG. 4.

The FM transmitter 205 may comprise suitable circuitry, logic and/or code that may enable the transmission of an FM signal via the coupler 201 and an antenna, not shown. The FM transmitter 205 may receive as inputs, in-phase and quadrature signals $I_{Tx}$ and $R_{Tx}$ generated by the DDFS 211B, and a signal to be modulated and transmitted, generated by a processor, such as the baseband processor 154, described with respect to FIG. 1A. The FM transmitter 205 is described further with respect to FIG. 4.

The coupler 201 may comprise suitable circuitry, logic and/or code that may enable both the reception and transmission of FM signals by an antenna, not shown. In instances where the FM transmitter 203 and the FM receiver 205 may transmit and receive, respectively, signals at a different frequency, the signals may be transmitted and received simultaneously.

In operation, the Bluetooth LOGEN 217 may generate $I_{BT}$ and $Q_{BT}$ signals for the transmission and reception of Bluetooth signals via the Bluetooth transmitter 221 and the Bluetooth receiver 219. The quadrature signal $Q_{BT}$ may also be communicated from the Bluetooth LOGEN 217 to the dividers 215A and 215B. The dividers 215A and 215B may reduce the frequency of the input signal and communicate an output signal to the DDFSs 211A and 211B, respectively. The DDFS 211A may receive the frequency divided clock signal and a frequency control signal $d_1(t)$ from the frequency word block 213A and generate output in-phase and quadrature signals $I_{Rx}$ and $Q_{Rx}$ that may be communicated to the FM receiver 203. The FM receiver 203 may utilize the in-phase and quadrature signals $I_{Rx}$ and $Q_{Rx}$ to demodulate a signal received by an antenna via the coupler 201.

The quadrature signal $Q_{Rx}$ may also be communicated to the DDFS 207, which may also receive as an input the frequency control signal $d_3(t)$. The DDFS 207 may generate an output signal at a frequency appropriate for NFC transmission and reception, 13.56 MHz for example, by the NFC Tx/Rx 209.

Due to the DDFS's ability to maintain phase when switching frequencies quickly, the NFC Tx/Rx 209 may incorporate time-division duplexing such that the transmission and reception of NFC signals may be near-simultaneous. In another embodiment of the invention, a second DDFS may be incorporated, allowing for simultaneous transmission and reception.

The DDFS 211B may receive as inputs the output signal generated by the divider 215B and the frequency control signal $d_2(t)$, and generate in-phase and quadrature signals $I_{Tx}$ and $Q_{Tx}$. The signals $I_{Tx}$ and $Q_{Tx}$ may be communicated to the FM transmitter 205 for generation of a signal to be transmitted by an antenna via the coupler 201.

Figure 3:
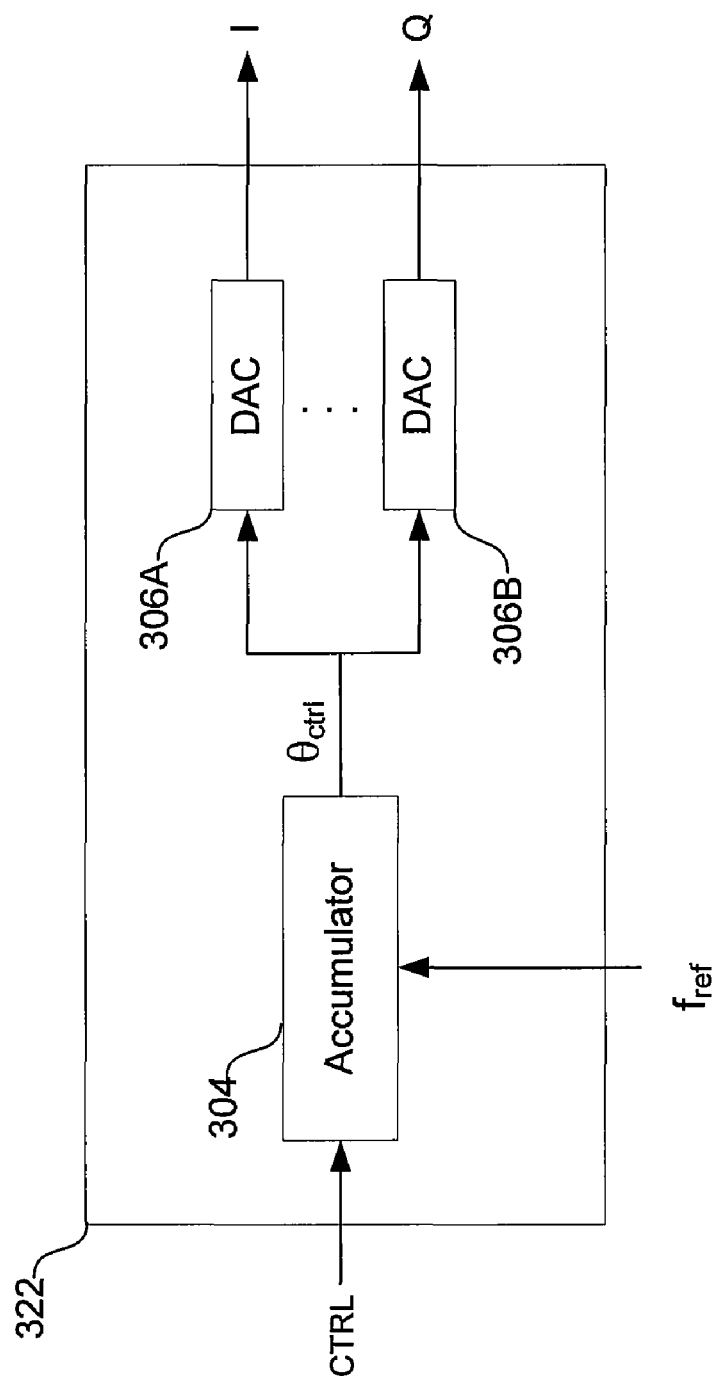
FIG. 3 is a block diagram of a direct digital frequency synthesizer in accordance with an embodiment of the invention.

FIG. 3 is a block diagram of a direct digital frequency synthesizer in accordance with an embodiment of the invention. Referring to FIG. 3, there is shown a DDFS 322 comprising an accumulator 304 and two digital to analog conversion (DAC) blocks 306A and 306B. In another embodiment of the invention, the DDFS 322 may comprise a single DAC such that the DDFS may generate a single output signal, such as in the DDFS 207, described with respect to FIG. 2. The accumulator block 304 may comprise suitable circuitry, logic, and/or code to enable successively adding CTRL to a value stored in the accumulator on each cycle of a reference clock. The accumulator 304 may also receive a reference signal, $f_{ref}$, which may be fixed-frequency or may be of varying frequency. In the case of a varying $f_{ref}$, the change in frequency may be compensated for by altering CTRL such that the frequency output by the DDFS may be unaffected. In this regard, CTRL and $f_{ref}$ may determine phase and frequency of output signals I and Q. For example, I and Q may be in phase and quadrature signals.

The DAC blocks 306A and 306B may comprise suitable circuitry, logic, and and/or code that may enable output of one or more signals of varying phase, frequency, or amplitude. In one embodiment, the DAC blocks 306B and 306B may comprise a number of lookup tables used to generate output signals I and Q. In this manner, the DDFS block 322 may be a digitally-controlled signal generator that may vary phase, frequency, and/or amplitude of one or more output signals based on a single reference clock, and a control word, CTRL.

In operation, CTRL may be provided to the accumulator 304, and may be successively added to a value stored in the accumulator 304 on each cycle of the reference clock. In this manner, the sum will eventually be greater than the maximum value the accumulator can store, and the value in the accumulator may overflow or "wrap". Accordingly, an N-bit accumulator may overflow at a frequency $f_{ddfs}$ given by the following equation.

$$f_{ddfs} = f_{ref}(CTRL/2^N)$$

In this manner, the output of the accumulator, $\theta_{ctrl}$, will be periodic with period $1/f_{ddfs}$ and may represent the phase angle of a signal. In this regard, the DDFS 322 may be well suited as a frequency generator that generates one or more sine waves or other periodic waveforms over a large range of frequencies, from almost DC to approximately half the reference clock frequency $f_{ref}$.

Prior to changing CTRL, the state of the DDFS 322 may be saved in, for example, a memory such as the system memory 158, described with respect to FIG. 1A. In this manner, the output signal may be interrupted and then resumed without losing the phase information comprising the generated signals. For example, each time the DDFS 322 may resume generating the signal, the saved state may be loaded from memory, and the signal may resume from the last phase angle transmitted before the DDFS interrupted the signal.

Figure 4:
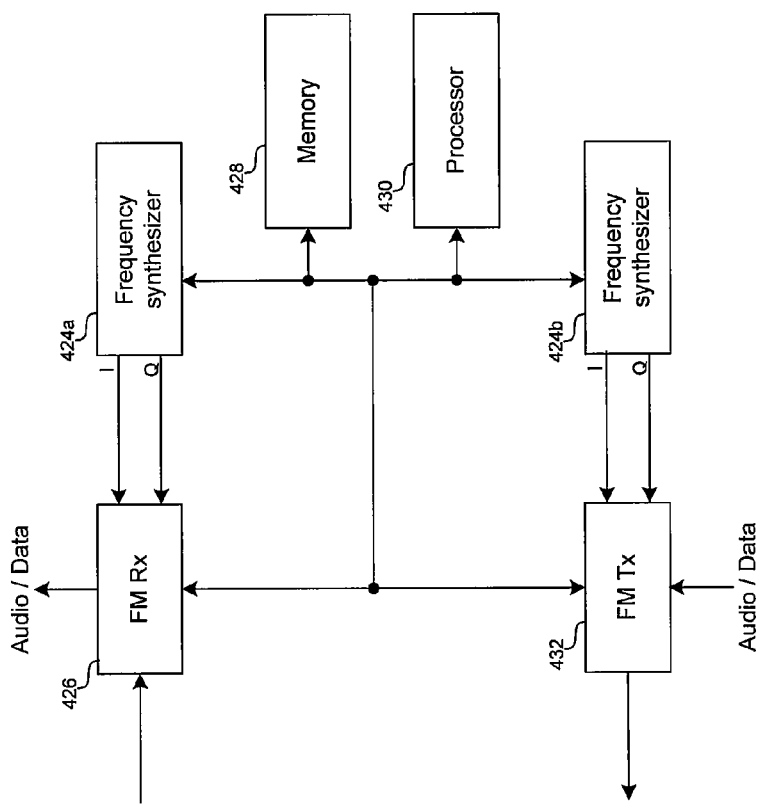
FIG. 4 is a block diagram of an exemplary system for FM transmission and reception, in accordance with an embodiment of the invention.

FIG. 4 is a block diagram of an exemplary system for FM transmission and reception, in accordance with an embodiment of the invention. Referring to FIG. 4, the radio 400 may comprise two frequency synthesizers 424a and 424b, an FM receive (Rx) block 426, a memory 428, a processor 430, and an FM transmit (Tx) block 432.

The frequency synthesizers 424a and 424b may comprise suitable circuitry, logic, and/or code that may enable generation of fixed or variable frequency signals. For example, the frequency synthesizers 424a and 424b may each comprise one or more DDFSs, such as DDFS 322 described with respect to FIG. 3, along with a clock source, such as a Bluetooth or RFID phase-locked loop (PLL) clock generator.

The memory 428 may comprise suitable circuitry, logic, and/or code that may enable storing information. In this regard, the memory 428 may, for example, enable storing information utilized for controlling and/or configuring the frequency synthesizers 424a and 424b. For example, the memory 428 may store the value of state variables that may be utilized to control the frequency output by each of the frequency synthesizers 424a and 424b. Additionally, the memory 428 may enable storing information that may be utilized to configure the FM Rx block 426 and the FM Tx block 432. In this regard, the FM RX block 426 and/or the FM Tx block 432 may comprise circuitry, logic, and/or code such as a filter, for example, that may be configured based on the desired frequency of operation.

The processor 430 may comprise suitable circuitry, logic, and/or code that may enable interfacing to the memory 428, the frequency synthesizers 424a and 424b, the FM Rx block 426 and/or the FM Tx block 432. In this regard, the processor 430 may be enabled to execute one or more instructions that enable reading and/or writing to/from the memory 428. Additionally, the processor 430 may be enabled to execute one or more instructions that enable providing one or more control signals to the frequency synthesizer 424, the FM Rx block 426, and/or the FM Tx block 432.

The FM Rx block 426 may comprise suitable circuitry, logic, and/or code that may enable reception of FM signals. In this regard, the FM Rx block 426 may be enabled to tune to a desired channel, amplify received signals, down-convert received signals, and/or demodulate received signals to, for example, output data and/or audio information comprising the channel. For example, the FM Rx block 426 may utilize in-phase and quadrature local oscillator signals generated by the frequency synthesizer 424a to down-convert received FM signals. The FM Rx block 426 may, for example, be enabled to operate over the "FM broadcast band", or approximately 60 MHz to 130 Mhz. Signal processing performed by the FM Rx block 426 may be performed entirely in the analog domain, or the FM Rx block 426 may comprise one or more analog to digital converters and/or digital to analog converters.

The FM Tx block 432 may comprise suitable circuitry, logic, and/or code that may enable transmission of FM signals. In this regard, the FM Tx block 432 may enable frequency modulating a carrier signal with audio/data information. In this regard, the carrier frequency may be generated by the clock frequency synthesizer 424b. The FM Tx block 432 may also enable up-converting a modulated signal to a frequency, for example, in the "FM broadcast band", or approximately 60 MHz to 130 MHz. Additionally, the FM Tx block 432 may enable buffering and/or amplifying a FM signal such that the signal may be transmitted via an antenna. In another embodiment of the invention, the frequency synthesizer 424a may comprise a DDFS that may be capable of providing FM modulation for the signal to be transmitted.

The FM Rx block 426 and the FM Tx block 432 may share an antenna or utilize separate antennas. In the case of a shared antenna, a directional coupler, transformer, or some other circuitry may be utilized to couple the Tx output and Rx input to an antenna via a coupler, such as the coupler 201 described with respect to FIG. 2.

In an exemplary operation of the system 400, one or more signals provided by the processor 430 may configure the system 400 to transmit and/or receive FM signals. To receive FM signals, the processor 430 may provide one or more control signals to frequency synthesizers 424a and 424b in order to generate appropriate LO frequencies based on the reference signal $f_{ref}$. In this regard, the processor may interface to the memory 428 in order to determine the appropriate state of any control signals provided to the frequency synthesizers 424a and 424b. In this manner, the transmit frequency and receive frequency may be determined independently. Accordingly, utilizing a transmit frequency different from the receive frequency may enable simultaneous transmission and reception of FM signals.

Figure 5:
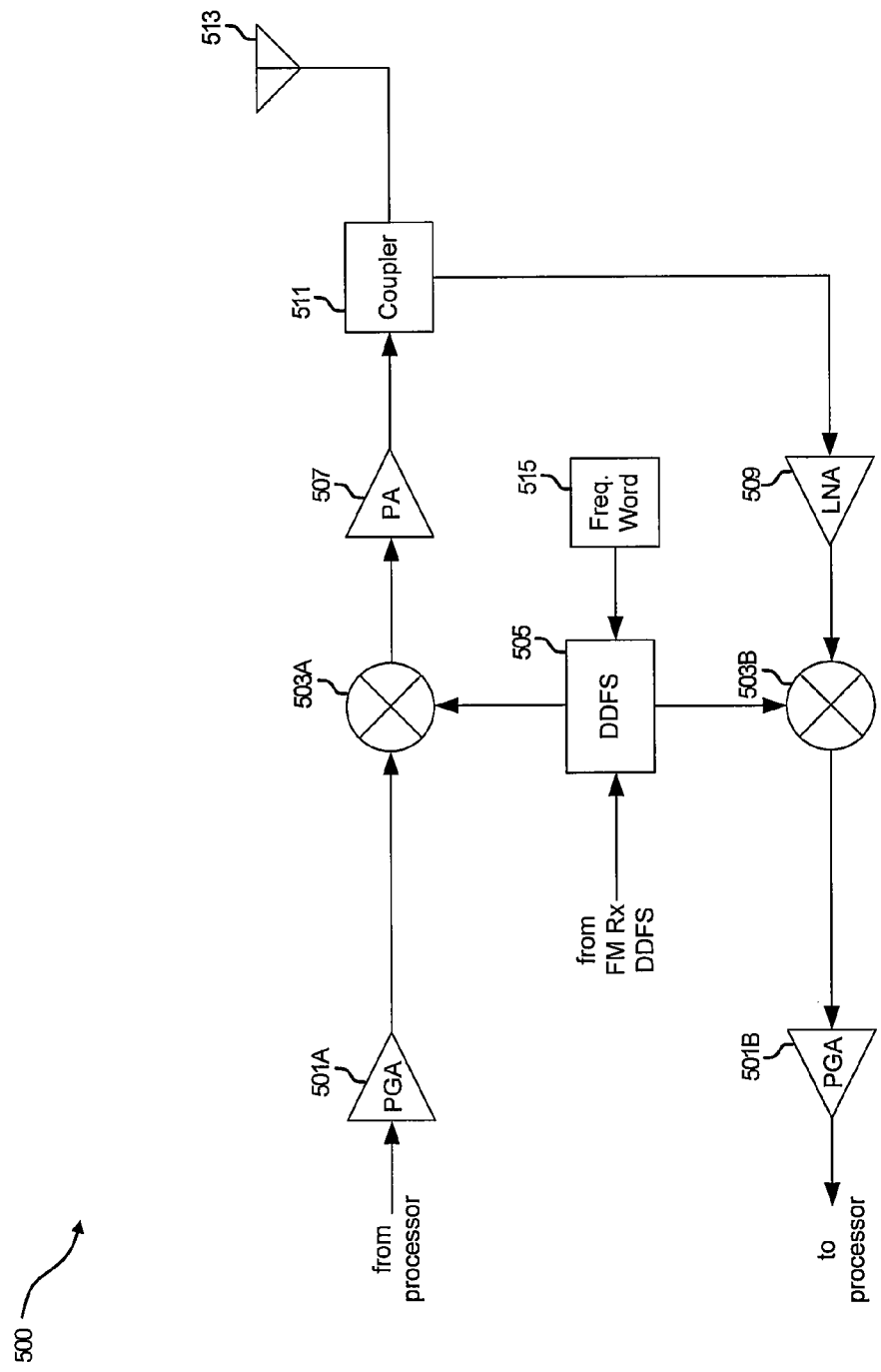
FIG. 5 is a block diagram illustrating an exemplary near field communication transmitter/receiver, in accordance with an embodiment of the invention.

FIG. 5 is a block diagram illustrating an exemplary near field communication transmitter/receiver, in accordance with an embodiment of the invention. Referring to FIG. 5 there is shown an NFC transmitter/receiver (Tx/Rx) 500 comprising programmable gain amplifiers (PGAs) 501A and 501B, mixers 503A and 503B, a DDFS 505, a power amplifier (PA) 507, a low noise amplifier (LNA) 509, a coupler 511, an antenna 513 and a frequency control block 515. The NFC Tx/Rx 500 may correspond to the NFC Tx/Rx 209, described with respect to FIG. 2.

The PGAs 501A and 501B may comprise suitable circuitry, logic and/or code that may enable the reception of an input signal and the generation of an output signal that may be amplified at a programmable gain level. The gain level may be determined by the strength of the received signal or the desired signal transmit level.

The DDFS 505 may be substantially similar to the DDFS 207, and the frequency control block 515 may be substantially similar to the frequency word block 213C, described with respect to FIG. 2. The DDFS 505 may receive as inputs, the clock signal generated by another DDFS, such as the DDFS 211A, described with respect to FIG. 2

The mixers 503A and 503B may comprise suitable circuitry, logic and/or code that may enable mixing two signals at two different frequencies, and generating an output signal may be at a frequency that is a sum or a difference of the frequencies of the input signals. The mixer 503A may receive as inputs, a clock signal generated by the DDFS 505 and the signal generated by the PGA 501A. The mixer 503B may receive as inputs, a clock signal generated by the DDFS 505 and the signal generated by the LNA 509.

The PA 507 may comprise suitable circuitry, logic and/or code that may enable the reception of an input signal and the generation of an output signal that may be amplified at a programmable gain level. The gain level may be determined by the desired signal transmit level via the antenna 513.

The LNA 509 may comprise suitable circuitry, logic and/or code that may enable the reception of an input signal and the generation of an output signal that may be amplified at a programmable gain level. The gain level may be determined by the strength of the signal received via the antenna 513.

The coupler 511 may comprise suitable circuitry, logic and/or code that may enable coupling of both transmitting and receiving circuitry to the same antenna. In an embodiment of the invention, the NFC transmitter/receiver 500 may transmit and receive non-simultaneously. Due to the DDFS's ability to maintain phase when switching frequencies quickly, the NFC transmitter/receiver 500 may incorporate time-division duplexing such that the transmission and reception of NFC signals may be near-simultaneous. In another embodiment of the invention, a second DDFS may be incorporated, allowing for simultaneous transmission and reception.

The antenna 513 may comprise suitable circuitry, logic and/or code that may enable transmission and reception of RF signals to and from the wireless medium.

In operation, an NFC signal to be transmitted by the NFC transmitter/receiver 500 and generated by a baseband processor, such as the baseband processor 154, described with respect to FIG. 1A, may be received by the PGA 501A. An amplified output signal may be generated and communicated to the mixer 503A, where it may be mixed with a clock signal generated by the DDFS 505. The mixer 503A may generate an up-converted output signal that may be communicated to the PA 507, which may generate an amplified output signal. The amplified output signal may be communicated to the coupler 511 and then to the antenna 513 for transmission.

A signal may be received by the antenna 513 and communicated to the LNA 509 via the coupler 511. The LNA 509 may generate an amplified output signal that may be communicated to the mixer 503B. The mixer 503B may also receive as an input, the clock signal generated by the DDFS 505, and generate a down-converted output signal that may be communicated to the PGA 501B. The PGA 501B may generate an amplified output signal that may communicated to a baseband processor, such as the baseband processor 154, described with respect to FIG. 1A.

Figure 6:
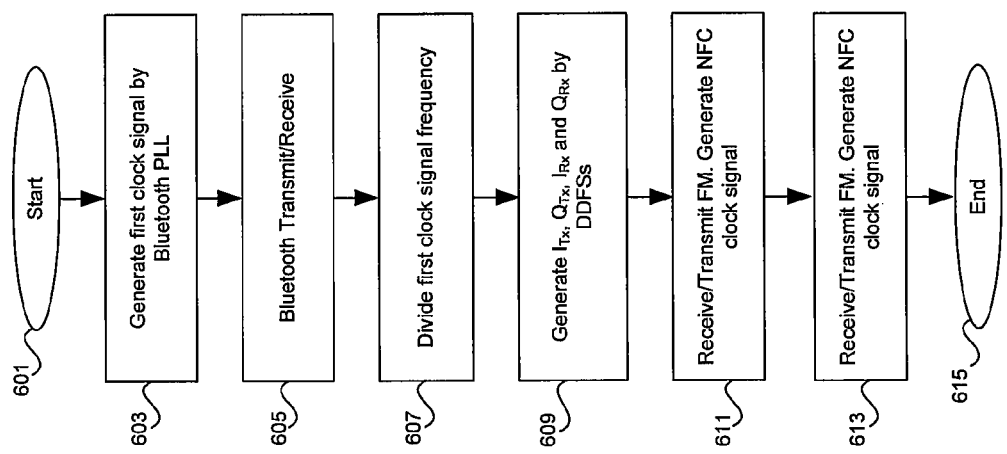
FIG. 6 is a flow diagram illustrating an exemplary transmit and receive process of a Bluetooth, FM and near field communication system, in accordance with an embodiment of the invention.

FIG. 6 is a flow diagram illustrating an exemplary transmit and receive process of a Bluetooth, FM and near field communication system, in accordance with an embodiment of the invention. Referring to FIG. 6, following start step 601, in step 603, the Bluetooth LOGEN 217 may generate a first clock signal. In step 605, the Bluetooth receiver 219 and Bluetooth transmitter 221 may receive and transmit Bluetooth signals, respectively. In step 607, the frequency of the first clock signal may be divided to a lower frequency. In step 609, the DDFSs 211A and 211B may generate the in-phase and quadrature signals $I_{Rx}$, $Q_{Rx}$, $I_{Tx}$, and $Q_{Tx}$. In step 611, the FM receiver 203 and the FM transmitter 205 may utilize the in-phase and quadrature signals $I_{Rx}$, $Q_{Rx}$, $I_{Tx}$, and $Q_{Tx}$ to receive and transmit FM signals. The quadrature signal $Q_{Rx}$ may be utilized by the DDFS 207 to generate an NFC clock signal. In step 613, the NFC Tx/Rx 209 may utilize the NFC clock signal to receive and/or transmit NFC signals, followed by end step 615.

In an embodiment of the invention, a method and system are disclosed for generating a first signal to enable transmission and/or reception of Bluetooth signals. A plurality of direct digital frequency synthesizers 207, 211A and 211B may be clocked via the generated first signal to enable simultaneous transmission and reception of frequency modulated signals, and also enable transmission and/or reception of near field communication signals. The first signal may be generated via a Bluetooth LOGEN 217 or a Bluetooth PLL, and may comprise an in-phase component $I_{BT}$ and a quadrature component $Q_{BT}$. The frequency of the first signal may be within the range of 2.4 GHz to 2.483 GHz, or may be at a frequency that may be frequency divided and then mixed with the first signal to result in a signal with a frequency within the range of 2.4 GHz to 2.483 GHz. One or more control word inputs $d_1(t)$, $d_2(t)$ and $d_3(t)$ may be generated to control each of the plurality of direct digital frequency synthesizers 207, 211A and 211B. The one or more control word inputs $d_1(t)$, $d_2(t)$ and/or $d_3(t)$ may be adjusted to compensate for changes in frequency of the generated first signal. Simultaneous NFC transmission and NFC reception may be simulated by switching the generated one or more control word inputs $d_3(t)$ to one or more of the plurality of direct digital frequency synthesizers 207, and may be switched between a plurality of values in successive time intervals to perform time division duplexing of the NFC transmission and NFC reception. The NFC transmission may occur at a first frequency and the NFC reception may occur at a second frequency.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:

in an RF chip comprising transmit and receive functions:
generating a first signal to enable transmission and/or reception of Bluetooth signals, wherein the first signal is input to a plurality of direct digital frequency synthesizers (DDFSs); and
clocking the plurality of DDFSs via the generated first signal to enable simultaneous transmission and reception of frequency modulated (FM) signals, and to enable transmission and/or reception of near field communication (NFC) signals.

2. The method according to claim 1, comprising generating via a local oscillator generator (LOGEN), the first signal to enable the transmission and/or the reception of the Bluetooth signals.

3. The method according to claim 1, comprising generating via a phase locked loop (PLL), the first signal to enable the transmission and/or the reception of the Bluetooth signals.

4. The method according to claim 1, wherein a frequency of the first signal is such that it may be frequency divided and then mixed with the first signal to result in a signal with a frequency within the range of 2.4 GHz to 2.483 GHz.

5. The method according to claim 1, wherein the generated first signal that enables the transmission and/or the reception of the Bluetooth signals comprises an in-phase component and a component.

6. The method according to claim 1, comprising generating one or more control word inputs to control each of the plurality of direct digital frequency synthesizers.

7. The method according to claim 6, comprising adjusting the generated one or more control word inputs to each of the plurality of direct digital frequency synthesizers to compensate for changes in frequency of the generated first signal.

8. The method according to claim 6, comprising simulating simultaneous NFC transmission and NFC reception by switching the generated one or more control word inputs to one or more of the plurality of direct digital frequency synthesizers.

9. The method according to claim 8, comprising switching the generated one or more control word inputs between a plurality of values in successive time intervals to perform time division duplexing of the simulated simultaneous NFC transmission and the NFC reception.

10. The method according to claim 9, wherein the NFC transmission occurs at a first frequency and the NFC reception occurs at a second frequency.

11. A system for wireless communication, the system comprising:

one or more circuits in an RF chip, the RF chip comprising transmit and receive functions, the one or more circuits being operable to:
generate a first signal to enable transmission and/or reception of Bluetooth signals, wherein the first signal is input to a plurality of direct digital frequency synthesizers (DDFSs); and
clock the plurality of DDFSs via the generated first signal to enable simultaneous transmission and reception of frequency modulated (FM) signals, and to enable transmission and/or reception of near field communication (NFC) signals.

12. The system according to claim 11, wherein the one or more circuits are operable to generate via a local oscillator generator (LOGEN), the first signal to enable the transmission and/or the reception of the Bluetooth signals.

13. The system according to claim 11, wherein the one or more circuits are operable to generate via a phase locked loop (PLL), the first signal to enable the transmission and/or the reception of the Bluetooth signals.

14. The system according to claim 11, wherein a frequency of the first signal is within the range of 2.4 GHz to 2.483 GHz.

15. The system according to claim 11, wherein a frequency of the first signal is such that it may be frequency divided and then mixed with the first signal to result in a signal with a frequency within the range of 2.4 GHz to 2.483 GHz.

16. The system according to claim 11, wherein the generated first signal that enables the transmission and/or the reception of the Bluetooth signals comprises an in-phase component and a quadrature component.

17. The system according to claim 11, wherein the one or more circuits are operable to generate one or more control word inputs to control each of the plurality of direct digital frequency synthesizers.

18. The system according to claim 17, wherein the one or more circuits are operable to adjust the generated one or more control word inputs to each of the plurality of direct digital frequency synthesizers to compensate for changes in frequency of the generated first signal.

19. The system according to claim 17, wherein the one or more circuits are operable to simulate simultaneous NFC transmission and NFC reception by switching the generated one or more control word inputs to one or more of the plurality of direct digital frequency synthesizers.

20. The system according to claim 19, wherein the one or more circuits are operable to switch the generated one or more control word inputs between a plurality of values in successive time intervals to perform time division duplexing of the simulated simultaneous NFC transmission and the NFC reception.

21. The system according to claim 20, wherein the NFC transmission occurs at a first frequency and the NFC reception occurs at a second frequency.

* * * * *